(12) United States Patent  (10) Patent No.: US 9,246,128 B2
Tsai et al.  (45) Date of Patent: Jan. 26, 2016

(54) ORGANIC LIGHT EMITTING DIODE DISPLAY DEVICE HAVING METAL ENCLOSING WALL

(71) Applicant: Innolux Corporation, Miao-Li County (TW)

(72) Inventors: Chi-Che Tsai, Miao-Li County (TW); Po-Ching Lin, Miao-Li County (TW); Wei-Yen Wu, Miao-Li County (TW); Hui-Chen Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/165,617

(22) Filed: Jan. 28, 2014

(65) Prior Publication Data

US 2014/0231767 A1 Aug. 21, 2014

(30) Foreign Application Priority Data

Feb. 18, 2013 (TW) .............................. 102105491 A

(51) Int. Cl.
*H01L 29/08* (2006.01)
*H01L 35/24* (2006.01)
*H01L 51/00* (2006.01)
*H01L 51/52* (2006.01)

(52) U.S. Cl.
CPC .................................. *H01L 51/5246* (2013.01)

(58) Field of Classification Search
None
See application file for complete search history.

(56) References Cited

U.S. PATENT DOCUMENTS

| 7,160,784 | B2 | 1/2007 | Yamazaki et al. | |
|---|---|---|---|---|
| 2002/0125484 | A1 | 9/2002 | Silvernail et al. | |
| 2007/0200492 | A1* | 8/2007 | Cok et al. | 313/506 |
| 2010/0109516 | A1* | 5/2010 | Warashina et al. | 313/504 |
| 2010/0304171 | A1 | 12/2010 | Tomantschger et al. | |
| 2010/0328282 | A1* | 12/2010 | Su et al. | 345/206 |
| 2011/0279023 | A1 | 11/2011 | Nishioka et al. | |

FOREIGN PATENT DOCUMENTS

| TW | 533463 | 5/2003 |
|---|---|---|
| TW | 200848887 A | 12/2008 |
| TW | 201037829 A | 10/2010 |

OTHER PUBLICATIONS

TW Office Action dated Apr. 17, 2015 in corresponding Taiwan application (No. 102105491).

* cited by examiner

*Primary Examiner* — Michael Jung
*Assistant Examiner* — Mikka Liu
(74) *Attorney, Agent, or Firm* — McClure, Qualey & Rodack, LLP

(57) ABSTRACT

An organic light emitting diode display device and a manufacturing method thereof are provided. The organic light emitting diode display device includes a first flexible substrate, a second flexible substrate, a first barrier layer, a second barrier layer, an organic light emitting diode element, and a metal enclosing wall. The first barrier layer is disposed on the first flexible substrate, and the second barrier layer is disposed on the second flexible substrate. The organic light emitting diode element is disposed between the first barrier layer and the second barrier layer. The metal enclosing wall connects the first flexible substrate to the second flexible substrate and surrounds the organic light emitting diode element.

13 Claims, 7 Drawing Sheets

ORGANIC LIGHT EMITTING DIODE DISPLAY DEVICE HAVING METAL ENCLOSING WALL

This application claims the benefit of Taiwan application Serial No. 102105491, filed Feb. 18, 2013, the subject matter of which is incorporated herein by reference.

BACKGROUND

1. Technical Field

The disclosure relates in general to an organic light emitting diode display device and a manufacturing method thereof, and particularly to an organic light emitting diode display device with superior water-oxygen resistant abilities and a manufacturing method thereof.

2. Description of the Related Art

Along with the progress of display technology, various types of display devices have been developed, among which organic light emitting diode display devices have become one of the most important research targets of display technology. Therefore, the development and design of arranging organic light emitting diodes in flexible display devices have advanced rapidly as well.

However, organic light emitting diodes are vulnerable to the oxidation by water (moisture) and oxygen, and thus the operating functions thereof are influenced. On the other hand, despite having superior water-oxygen resistant abilities, frits are rarely adopted as barrier structures due to the difficulties of frits conforming to the requirements of flexibility of display devices. In view of that, the research and development of the resistance to water and oxygen for flexible organic light emitting diode display devices have become a huge challenge. Therefore, researchers have been working on providing flexible organic light emitting diode display devices with superior water-oxygen resistant abilities.

SUMMARY

The disclosure relates to an organic light emitting diode display device and a manufacturing method thereof. In the organic light emitting diode display device, a metal enclosing wall connects two flexible substrates and surrounds the organic light emitting diode element to form a lateral barrier structure to prevent water and oxygen penetration, together with the barrier layers disposed above and below the organic light emitting diode element, respectively, the water-oxygen resistant abilities of the whole display device can be significantly increased.

According to an aspect of the present disclosure, an organic light emitting diode (OLED) display device is provided. The organic light emitting diode display device comprises a first flexible substrate, a second flexible substrate, a first barrier layer, a second barrier layer, an organic light emitting diode element, and a metal enclosing wall. The first barrier layer is disposed on the first flexible substrate, and the second barrier layer is disposed on the second flexible substrate. The organic light emitting diode element is disposed between the first barrier layer and the second barrier layer. The metal enclosing wall connects the first flexible substrate to the second flexible substrate and surrounds the organic light emitting diode element.

According to another aspect of the present disclosure, a manufacturing method of an organic light emitting diode display device is provided. The manufacturing method includes the following steps: providing a first flexible substrate and a second flexible substrate; disposing a first barrier layer on the first flexible substrate; disposing a second barrier layer on the second flexible substrate; disposing an organic light emitting diode element on the first flexible substrate; forming a first patterned metal layer on the first flexible substrate and forming a second patterned metal layer on the second flexible substrate; assembling the first flexible substrate to the second flexible substrate; and heating the first patterned metal layer and the second patterned layer to form a metal enclosing wall, the metal enclosing wall connecting the first flexible substrate to the second flexible substrate and surrounding the organic light emitting diode element.

According to a further aspect of the present disclosure, a manufacturing method of an organic light emitting diode display device is provided. The manufacturing method includes the following steps: providing a first flexible substrate and a second flexible substrate; disposing a first barrier layer on the first flexible substrate; disposing a second barrier layer on the second flexible substrate; disposing an organic light emitting diode element on the first flexible substrate; forming a first metal layer on the first flexible substrate and forming a second metal layer on the second flexible substrate; forming a third metal layer between the first metal layer and the second metal layer, wherein the material of the third metal layer is different from the materials of the first metal layer and the second metal layer; providing a filler covering the organic light emitting diode element; assembling the first flexible substrate to the second flexible substrate; and heating the first metal layer, the second metal layer, and the third metal layer to form a metal enclosing wall, the metal enclosing wall connecting the first flexible substrate to the second flexible substrate and surrounding the organic light emitting diode element.

The above and other aspects of the disclosure will become better understood with regard to the following detailed description of the non-limiting embodiment(s). The following description is made with reference to the accompanying drawings.

DETAILED DESCRIPTION

In the embodiments of the present disclosure, an organic light emitting diode display device and a manufacturing method thereof are provided. In the organic light emitting diode display device, a metal enclosing wall connects two flexible substrates and surrounds the organic light emitting diode element to form a lateral barrier structure to prevent water and oxygen penetration, together with the barrier layers disposed above and below the organic light emitting diode element, respectively, the water-oxygen resistant abilities of the whole display device can be significantly increased. The following embodiments are for the purpose of elaboration only, not for limiting the scope of protection of the disclosure. Detailed structures and processes may be modified or changed by one skilled in the art after having the benefit of this description of the disclosure.

Figure 1A:
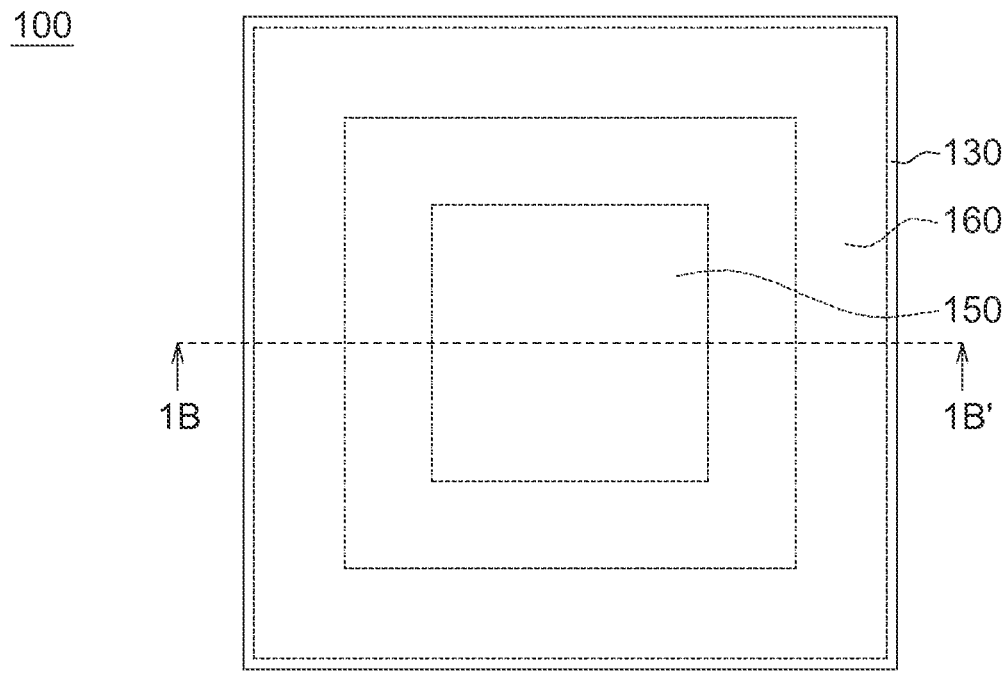
FIG. 1A shows a schematic diagram of the organic light emitting display device according to an embodiment of the present disclosure.
Figure 1B:
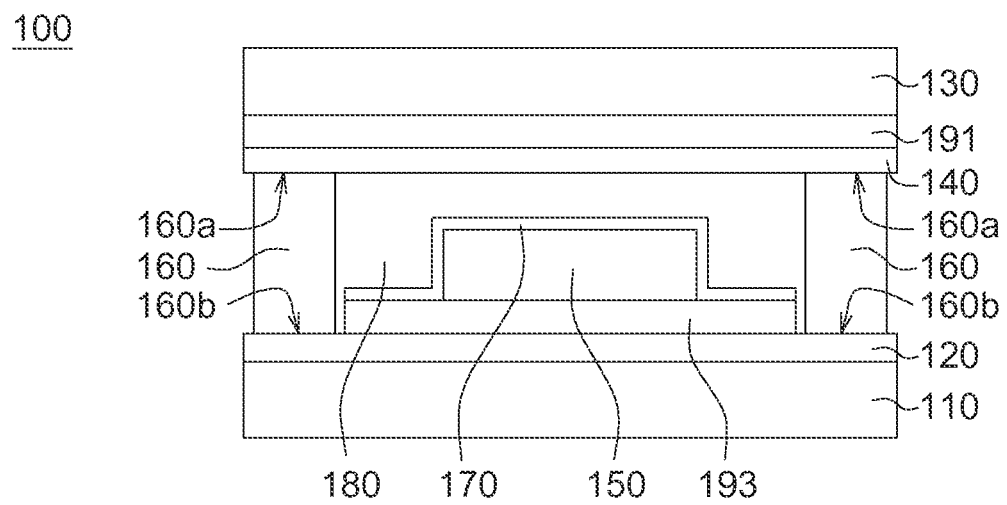
FIG. 1B shows a cross-sectional view along the section line 1B-1B' in FIG. 1A.

Referring to FIGS. 1A-1B, FIG. 1A shows a schematic diagram of the organic light emitting display device 100 according to an embodiment of the present disclosure, and FIG. 1B shows a cross-sectional view along the section line 1B-1B' in FIG. 1A. As shown in FIGS. 1A-1B, the organic light emitting diode display device 100 comprises a first flexible substrate 110, a first barrier layer 120, a second flexible substrate 130, a second barrier layer 140, an organic light emitting diode element 150, and a metal enclosing wall 160. The first barrier layer 120 is disposed on the first flexible substrate 110, and the second barrier layer 140 is disposed on the second flexible substrate 130. The organic light emitting diode element 150 is disposed between the first barrier layer 120 and the second barrier layer 140. The metal enclosing wall 160 connects the first flexible substrate 110 to the second flexible substrate 130 and surrounds the organic light emitting diode element 150, such that the organic light emitting diode element 150 can be sealed between the first flexible substrate 110 and the second flexible substrate 130.

As shown in FIG. 1A, the second flexible substrate 130 is assembled to the first flexible substrate 110, and the metal enclosing wall 160 surrounds the organic light emitting diode element 150 to form a lateral barrier structure to prevent water and oxygen penetration. With the metal enclosing wall 160 together with the first barrier layer 120 below the organic light emitting diode element 150 and the second barrier layer 140 above the organic light emitting diode element 150, the whole display device is provided with an excellent water-oxygen resistant ability with a water vapor transmission rate (WVTR) of $10^{-6}$.

As shown in FIG. 1B, the metal enclosing wall 160 may have a microstructure (not shown) formed on the surface 160b thereof connected to the first flexible substrate 110, and the metal enclosing wall 160 may further have a microstructure (not shown) formed on the surface 160a thereof connected to the second flexible substrate 130. The microstructure(s) are such as roughened surfaces. Due to the differences in the thermal expansion coefficients between layers, the holding stress between layers may result in peeling of layers; and in view of that, the microstructure(s) can compensate the stress and prevent the layers from peeling. In addition, the microstructure(s) may increase the connection between the metal enclosing wall 160 and the flexible substrates 110 and 130 as well, and the water-oxygen resistant effect can be further improved. Furthermore, the microstructure(s) formed on the connection surfaces between adjacent layers can prolong the penetration paths for water and oxygen, which can further improve the water-oxygen resistant effect as well.

In the embodiment, the material of the metal enclosing wall 160 may include a metal with a low melting point or a solid solution metal. In the embodiment, the metal with a low melting point is such as tin (Sn). In the embodiment, the solid solution metal is such as tin-gold (SnAu) alloy, tin-nickel (SnNi) alloy, tin-antimony (SnSb) alloy, tin-lead (SnPb) alloy, tin-bismuth (SnBi) alloy, and/or tin-copper (SnCu) alloy. These alloys have alloy phases formed by dissolving solute atoms into lattices of metal solvents at set ratios of the solute atoms to the metal solvents. The elements from the solute and from the solvent are miscible in both liquid phase and solid phase, forming a uniform material. In one embodiment, the tin-lead (SnPb) alloy includes such as 63% atomic ratio of tin and 37% atomic ratio of lead, and the melting point of the alloy is 183° C.

In the embodiment, the materials of the first flexible substrate 110 and the second flexible substrate 130 are retractable thin transparent substrates, such as polyimide (PI), and of which the thicknesses are about 10-15 μm. In the embodiment, the first barrier layer 120 and the second barrier layer 140 are independently silicon nitride (SiN) or stacked layers of silicon nitride and silicon oxide ($SiN_x/SiO_x$), and both have water-oxygen resistant abilities.

As shown in FIG. 1B, the organic light emitting diode display device 100 may further include a third barrier layer 170, and the third barrier layer 170 is formed on and covering the organic light emitting diode element 150. The third barrier layer 170 is provided with water-oxygen resistant abilities, which is advantageous to preventing the organic light emitting diode element 150 from being oxidized by water and oxygen. The third barrier layer 170 is such as a silicon nitride layer or stacked layers of silicon nitride and silicon oxide.

As shown in FIG. 1B, the organic light emitting diode display device 100 may further include a filler 180. The filler 180 is filled inside the metal enclosing wall 160 and covering the organic light emitting diode element 150.

The organic light emitting diode display device 100 may further include a color filter 191 and/or a thin film transistor layer 193. In one embodiment, as shown in FIG. 1B, the organic light emitting diode element 150 is such as a white light organic light emitting diode, the color filter 191 is disposed between the second flexible substrate 130 and the organic light emitting diode 150, and the thin film transistor layer 193 is disposed between the first flexible substrate 110 and the organic light emitting diode element 150. In an alternative embodiment, the organic light emitting diode element 150 is such as a RGB organic light emitting diode, and in such case, a color filter is not required to be disposed between the second flexible substrate 130 and the organic light emitting diode element 150.

Figure 2:
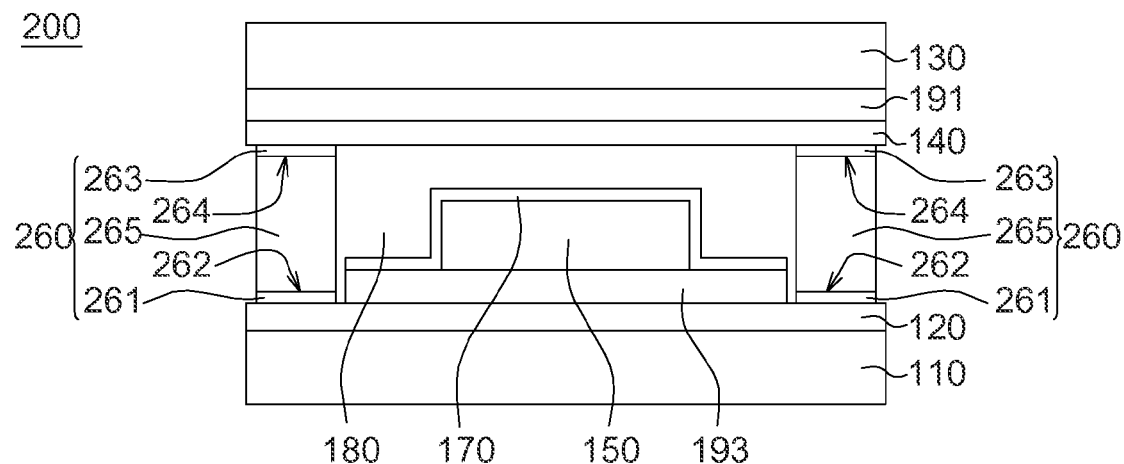
FIG. 2 shows a schematic diagram of the organic light emitting display device according to another embodiment of the present disclosure.

Referring to FIG. 2, FIG. 2 shows a schematic diagram of the organic light emitting display device 200 according to another embodiment of the present disclosure. As shown in FIG. 2, the present embodiment and the embodiment as shown in FIGS. 1A-1B are different in that, in the organic light emitting diode display device 200, the metal enclosing wall 260 further includes a first metal layer 261, a second metal layer 263, and a third metal layer 265. The first metal layer 261 is connected to the first flexible substrate 110, the second metal layer 263 is connected to the second flexible substrate 130, and the third metal layer 265 is formed between the first metal layer 261 and the second metal layer 263. In the embodiment, the materials of the first metal layer 261 and the second metal layer 263 may be the same or different from each other. The material of the third metal layer 265 is different from the materials of the first metal layer 261 and the second metal layer 263. The elements in the present embodiment sharing the same labels with those in the previous embodiment are the same elements, and the description of which is omitted.

As shown in FIG. 2, the interface 262 between the first metal layer 261 and the third metal layer 265 may have a microstructure (not shown) formed thereon, and the interface 264 between the second metal layer 263 and the third metal layer 265 may have a microstructure (not shown) formed thereon as well. The microstructures can increase the connection between the first metal layer 261, the second metal layer 263, and the third metal layer 265, contributing to forming the continuous wall structure of the metal enclosing wall 260. In other words, in the structure of the metal enclosing wall 260, the joint surfaces between the first metal layer 261, the second metal layer 263, and the third metal layer 265 can be regarded as not existed; accordingly, the overall water-oxygen resistant ability is greatly improved.

In the embodiment, the thickness of the first metal layer 261 and the thickness of the second metal layer 263 are such as 300-1000 nm.

In the embodiment, the materials of the first metal layer 261 and the second metal layer 263 may include at least a conductive metal commonly used in general manufacturing processes, such as aluminum (Al), molybdenum (Mo), or aluminum-niobium (AlNb) alloy. In the embodiment, the materials of the first metal layer 261 and the second metal layer 263 may include a metal with a low melting point or a solid solution metal. The metal with a low melting point is such as tin (Sn). The solid solution metal is such as tin-gold (SnAu) alloy, tin-nickel (SnNi) alloy, tin-antimony (SnSb) alloy, tin-lead (SnPb) alloy, tin-bismuth (SnBi) alloy, and/or tin-copper (SnCu) alloy. These alloys have alloy phases formed by dissolving solute atoms into lattices of metal solvents at set ratios of the solute atoms to the metal solvents. The elements from the solute and from the solvent are miscible in both liquid phase and solid phase, forming a uniform material. In one embodiment, the tin-lead (SnPb) alloy includes such as 63% atomic ratio of tin and 37% atomic ratio of lead, and the melting point of the alloy is 183° C. In the embodiment, the material of the third metal layer 265 comprises such as an organic-inorganic mixture material, the organic-inorganic mixture material comprising an organic material portion and an inorganic material portion. The organic material portion may comprise water resistant colloid, such as epoxy or silicone; the inorganic material portion may comprise a metal with a low melting point or a solid solution metal. The metal with a low melting point is such as tin. The solid solution metal is such as tin-gold (SnAu) alloy, tin-nickel (SnNi) alloy, tin-antimony (SnSb) alloy, tin-lead (SnPb) alloy, tin-bismuth (SnBi) alloy, and/or tin-copper (SnCu) alloy.

In the embodiment, the metal enclosing wall 260 is formed by such as impregnating and uniformly distributing metal micro-particles in a raw material (e.g. colloidal material), followed by melting the metal micro-particles by such as a thermal-pressing process or a microwave process to form continuous interfaces after assembling, as such a barrier having an organic/inorganic multi-layered structure is formed. The high homogeneity between the materials of the first metal layer 261, the second metal layer 263, and the third metal layer 265 is advantageous to forming the continuous wall structure of the metal enclosing wall 260 in the subsequent processes, by applying heat and pressure.

Figure 3:
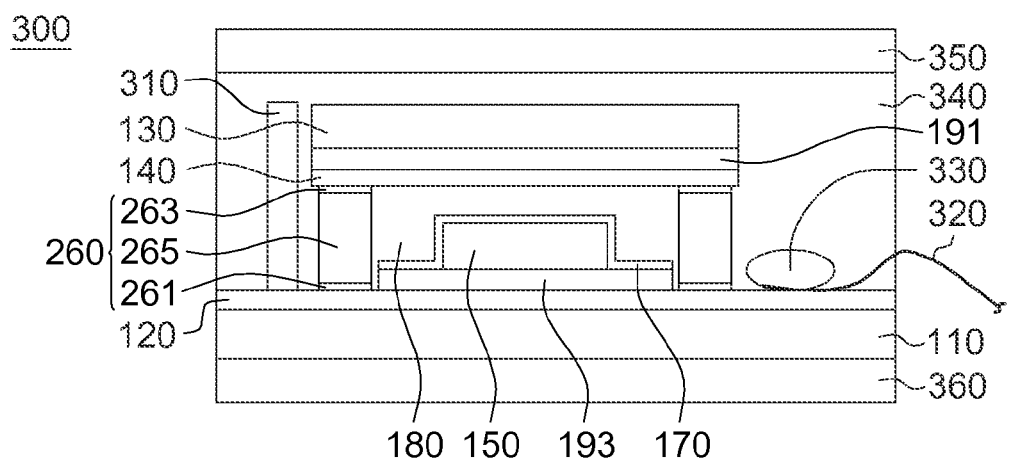
FIG. 3 shows a schematic diagram of the organic light emitting display device according to a further embodiment of the present disclosure.

Referring to FIG. 3, FIG. 3 shows a schematic diagram of the organic light emitting display device 300 according to a further embodiment of the present disclosure. The metal enclosing wall 260 of the embodiment as shown in FIG. 2 is taken as an example for illustrating the present embodiment but not limited thereto; the metal enclosing wall 160 of the embodiment as shown in FIG. 1 may apply in the present embodiment as well. The elements in the present embodiment sharing the same labels with those in the previous embodiments are the same elements, and the description of which is omitted.

As shown in FIG. 3, the organic light emitting diode display device 300 may further include an IC component 310 or a flexible cable 320. The organic light emitting diode display device 300 may include both the IC component 310 and the flexible cable 320 as well. The IC component 310 and the flexible cable 320 are bonded to the first flexible substrate 110. As shown in FIG. 3, the flexible cable 320 is bonded to the first flexible substrate 110 with the solder pad 330. In other words, the IC component 310 and the flexible cable 320 are electrically connected to the organic light emitting diode element 150 and/or the thin film transistor layer 193 with the first flexible substrate 110.

As shown in FIG. 3, the organic light emitting diode display device 300 may further include an encapsulating glue 340. The encapsulating glue 340 is formed on the first flexible substrate 110. In the embodiment, the encapsulating glue 340 is water-oxygen resistant. In the embodiment, as shown in FIG. 3, the size of the second flexible substrate 130 is smaller than the size of the first flexible substrate 110, and the encapsulating glue 340 covers the first flexible substrate 110, the second flexible substrate 130, and the metal enclosing wall 260. In the embodiment, the top surface of the encapsulating glue 340 is such as planar, which is advantageous to the formation of additional films on the encapsulating glue 340 in the subsequent manufacturing processes.

As shown in FIG. 3, the organic light emitting diode display device 300 may further include a first functional film 350 and/or a second functional film 360. The encapsulating glue 340 is provided with a sufficient adhesive ability for the first functional film 350 to be adhered directly on the encapsulating glue 340 without requiring any additional adhesive layers. In the embodiment, the thickness of the first functional film 350 is about 200-300 μm. The second functional film 360 is disposed below the first flexible substrate 110; in the embodiment, the thickness of the second functional film 360 is lower than the thickness of the first functional film 350. In the embodiment, the first functional film 350 and the second functional film 360 are such as transparent water-oxygen resistant films, and of which the materials are such as poly methyl methacrylate (PMMA), polyethylene terephthalate (PET), or polycarbonate (PC).

The embodiments disclosed below are for elaborating a manufacturing method of the organic light emitting diode display device of the disclosure. However, the descriptions disclosed in the embodiments of the disclosure such as detailed manufacturing procedures are for illustration only, not for limiting the scope of protection of the disclosure. People having ordinary skills in the art may modify or change the steps disclosed in the embodiments according actual needs. Referring to FIGS. 4A-4F, a process for manufacturing an organic light emitting diode display device according to an embodiment of the present disclosure is illustrated.

Figure 4A:
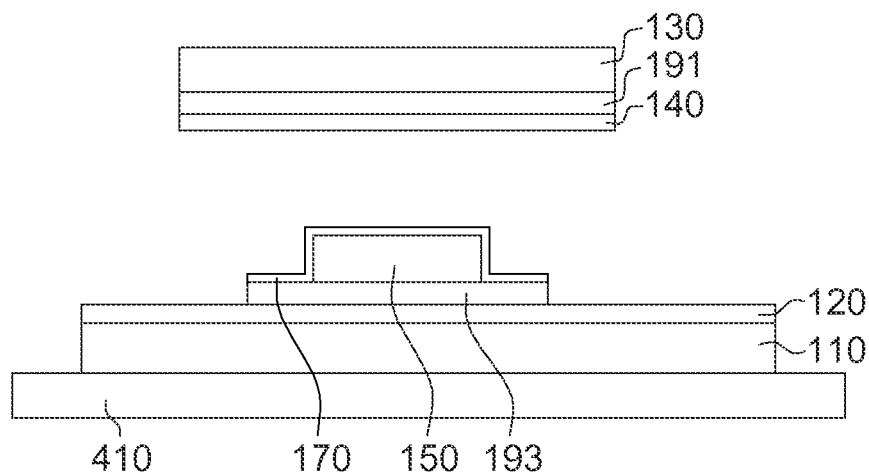
FIGS. 4A-4F illustrate a process for manufacturing an organic light emitting diode display device according to an embodiment of the present disclosure.

As shown in FIG. 4A, a rigid carrier 410 is provided, and the first flexible substrate 110 and the second flexible substrate 130 are provided. The first flexible substrate 110 is such as formed on the rigid carrier 410. In the embodiment, the material of the rigid carrier 410 is such as stainless steel or glass.

As shown in FIG. 4A, next, the first barrier layer 120 is disposed on the first flexible substrate 110, the second barrier layer 140 is disposed on the second flexible substrate 130, and the organic light emitting diode element 150 is disposed on the first flexible substrate 110.

As shown in FIG. 4A, the thin film transistor layer 193 may be further disposed between the organic light emitting diode element 150 and the first barrier layer 120, and the third barrier layer 170 may be further disposed on the organic light emitting diode element 150 and covering the organic light emitting diode element 150. The third barrier layer 170 may further protect the organic light emitting diode element 150 from damage by water and oxygen, particularly in the subsequent manufacturing processes of filling liquid or colloidal filler. In the embodiment, when a white organic light emitting diode is adopted as the organic light emitting diode element 150, the color filter 191 may further be disposed between the second barrier layer 140 and the second flexible substrate 130.

Figure 4B:
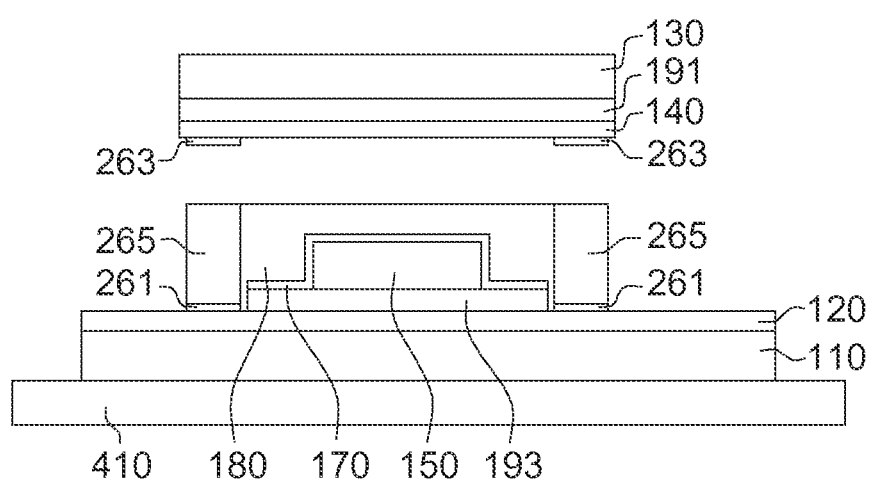

As shown in FIG. 4B, the first metal layer 261 is formed on the first flexible substrate 110, and the second metal layer 263 is formed on the second flexible substrate 130. Next, the third metal layer 265 is formed between the first metal layer 261 and the second metal layer 263, wherein the material of the third metal layer 265 is different from the materials of the first metal layer 261 and the second metal layer 263. In the embodiment, as shown in FIG. 4B, the third metal layer 265 is such as formed on the first metal layer 261.

In the embodiment, prior to the formation of the first metal layer 261 and the second metal layer 263, microstructures may be formed on the surfaces on which the metal layers 261 and 263 are predetermined to be formed. In the embodiment, prior to the formation of the third metal layer 265, microstructures may also be formed on the predetermined interfaces between the first metal layer 261, the second metal layer 263, and the third metal layer 265. In the embodiment, microstructures are formed on local regions of the surfaces of the first barrier layer 120 and the second barrier layer 140 where the metal layers 261 and 263 are predetermined to be formed on, as well as on the surfaces of the first metal layer 261 and the second metal layer 263. As such, the metal raw materials of the metal layers 261 and 263 may penetrate through the pores of the microstructures on the interfaces between layers more easily, rendering the formation of more compact structures on the interfaces between the metal layers 261, 263 and the barrier layers 120, 140. Accordingly, the chances that penetration and diffusion of water and/or oxygen through the bottom of the metal enclosing wall 260 into inside the device are reduced, leading to the metal enclosing wall (lateral water-oxygen barrier structure) having excellent water-oxygen resistant abilities. Likewise, the microstructures make the structures of the interfaces between the first metal layer 261, the second metal layer 263, and third metal layer 265 more compact, which facilitates the formation of the seamless wall structure of the metal enclosing wall 260, leading to the metal enclosing wall (lateral water-oxygen barrier structure) having excellent water-oxygen resistant abilities.

In the embodiment, the first metal layer 261 and the second metal layer 263 are formed by such as opening a mask and performing a sputtering process. Compared to conventional processes of forming frits of plastic materials, which have high viscosity and suffer from a higher difficulty in penetrating through the pores on the interfaces between layers, in the embodiments of the present disclosure, the first metal layer 261 and the second metal layer 263 are formed by a gas sputtering process, and the raw materials of the metal layers are delivered to form the metal layers 261 and 263 in a layer by layer fashion, such that the liquefied metal materials, which are formed after being heated and melted, can penetrate though the pores of the interfaces between the layers more easily, leading to more compact structures of the first metal layer 261 and the second metal layer 263. Accordingly, the chances of the penetration and diffusion of water or oxygen from the lateral side of the package into the device are reduced, and defects are not formed on the bottom of the metal enclosing wall (lateral water-oxygen barrier structure). However, as long as the patterns of the first metal layer 261 and the second metal layer 263 can be formed, the selections of manufacturing methods of the metal layers 261 and 263 may vary according to actual needs and are not limited thereto. In the embodiment, the third metal layer 265 is formed of a solder particle mixture material with high viscosity, and the third metal layer 265 is formed by, for example, coating a highly-viscous solder particle mixture material on the first metal layer 261. The third metal layer 265 having a fixed morphology formed on the first metal layer 261 is advantageous to restricting and preventing the liquefied or colloidal filler from overflowing outside the substrates.

Next, the filler 180 is provided for covering the organic light emitting diode element 150. In the embodiment, the liquefied or colloidal filler 180 is provided to fill inside the range enclosed by the third metal layer 265. In the embodiment, a moisture absorbent may be further added into the filler 180 or coated on the inner walls of the first metal layer 261 and the third metal layer 265. The filler 180, either with a moisture absorbent added therein or not, may further absorb the residual moisture around the organic light emitting diode element 150 remained during the manufacturing processes.

Figure 4C:
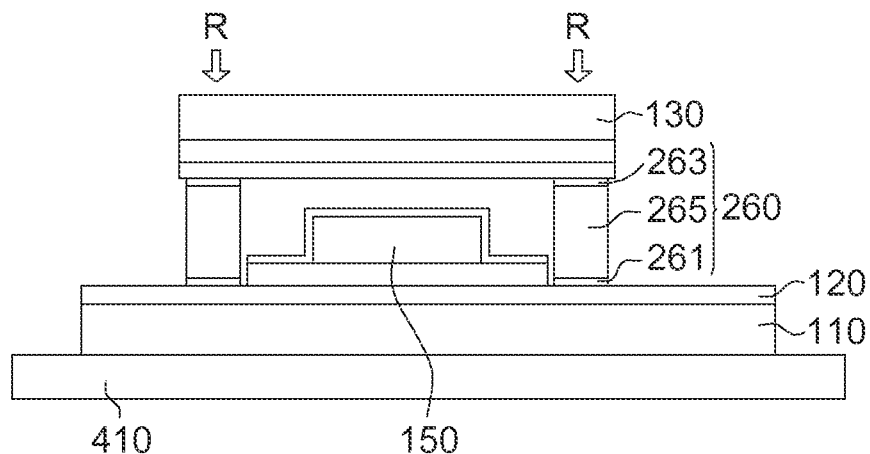

As shown in FIG. 4C, the first flexible substrate 110 is assembled to the second flexible substrate 130, and the first metal layer 261, the second metal layer 263, and the third metal layer 265 are heated to form the metal enclosing wall 260. The metal enclosing wall 260 connects the first flexible substrate 110 to the second flexible substrate 130 and surrounds the organic light emitting diode element 150, such that the organic light emitting diode element 150 is nicely sealed between the first flexible substrate 110 and the second flexible substrate 130.

In the embodiment, prior to heating the metal layers 261, 263, and 265, the filler 180 is solidified for turning it from liquefied or colloidal material to a solid material. The filler 180 is solidified before the metal layers 261, 263, and 265 are heated, such that as the metal layers 261, 263, and 265 are heated and melted, the solid filler 180 can prevent the liquefied metal layers 261, 263, and 265 from overflowing toward the visible area of the display device. In the embodiment, a moisture absorbent may further be added onto the surface of the filler 180.

In the embodiment, the heating treatment is performed locally on the regions where the first metal layer 261, the second metal layer 263, and the third metal layer 265 are located. While the regions are being heated, a pressure is applied to the same regions simultaneously as well; for example, as shown in FIG. 4C, the regions are heated and pressed along the direction indicated by the arrow R. In the embodiment, the materials of the first metal layer 261, the second metal layer 263, and the third metal layer 265 have a high homogeneity, such that the first metal layer 261, the second metal layer 263, and the third metal layer 265 can form the metal enclosing wall 260 having a continuous wall structure after being heated and pressed, and hence a more compact structure is manufactured, providing a superior water-oxygen resistant effect. In the embodiment, the first metal layer 261 and the second metal layer 263 are formed of a conductive metal commonly used in general manufacturing processes, such as aluminum (Al), molybdenum (Mo), or aluminum-niobium (AlNb) alloy. In the embodiment, the materials of the first metal layer 261 and the second metal layer 263 may include a metal with a low melting point or a solid solution metal. The metal with a low melting point is such as tin (Sn). The solid solution metal is such as tin-gold (SnAu) alloy, tin-nickel (SnNi) alloy, tin-antimony (SnSb) alloy, tin-lead (SnPb) alloy, tin-bismuth (SnBi) alloy, and/or tin-copper (SnCu) alloy. These alloys have alloy phases formed by dissolving solute atoms into lattices of metal solvents at set ratios of the solute atoms to the metal solvents. The elements from the solute and from the solvent are miscible in both liquid phase and solid phase, forming a uniform material. In one embodiment, the tin-lead (SnPb) alloy includes such as 63% atomic ratio of tin and 37% atomic ratio of lead, and the melting point of the alloy is 183° C. In the embodiment, the material of the third metal layer 265 may comprise an organic-inorganic mixture material, the organic-inorganic mixture material comprising an organic material portion and an inorganic material portion. The organic material portion may comprise a water resistant colloid, such as an epoxy resin or a silicone. The inorganic material portion may comprise a metal with a low melting point or a solid solution metal, the metal with a low melting point is such as tin, and the solid solution metal may be tin-gold (SnAu) alloy, tin-nickel (SnNi) alloy, tin-antimony (SnSb) alloy, tin-lead (SnPb) alloy, tin-bismuth (SnBi) alloy, and/or tin-copper (SnCu) alloy.

In the embodiment, the manufacturing method of the metal enclosing wall 260 includes, such as, impregnating and uniformly distributing metal micro-particles into a raw material (e.g. colloidal material), followed by manufacturing processes, such as a thermal-pressing process or a microwave process, to melt the metal micro-particles and form a continuous interface after assembling, for forming a barrier with an organic/inorganic multilayered structure. In the embodiment, the first metal layer 261, the second metal layer 263, and the third metal layer 265 are heated at a temperature of lower than 230° C. and pressed at a pressure of lower than 2 MPa. In one embodiment, the first metal layer 261, the second metal layer 263, and the third metal layer 265 are heated at 180° C. and pressed at 1 MPa for about 10 seconds. However, the conditions of the heating and pressing treatments and of which the time durations may vary depending the actual applications and are not limited thereto, as long as the properties of the already-formed elements are not influenced (e.g. when the temperature is too high, the elements or the flexible substrates may be damaged, or the layers may peel), and the metal layers 261, 263, and 265 can melt and form the metal enclosing wall 260 having a continuous wall structure.

Figure 4D:
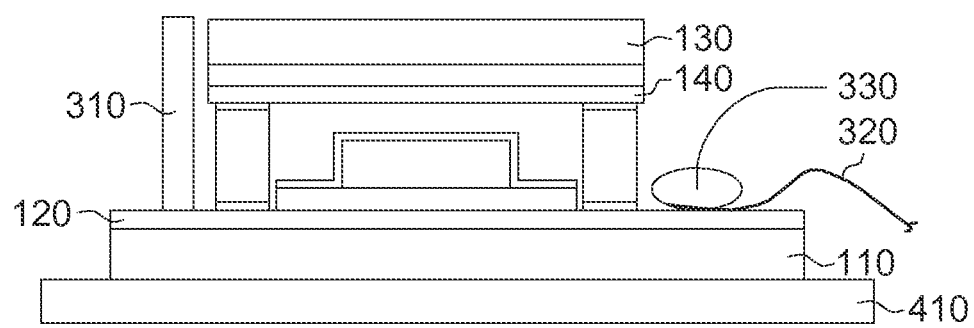

As shown in FIG. 4D, the IC component 310 and the flexible cable 320 may further be disposed to bond to the first flexible substrate 110. The flexible cable 320 is bonded to the first flexible substrate 110 with the solder pad 330.

Figure 4E:
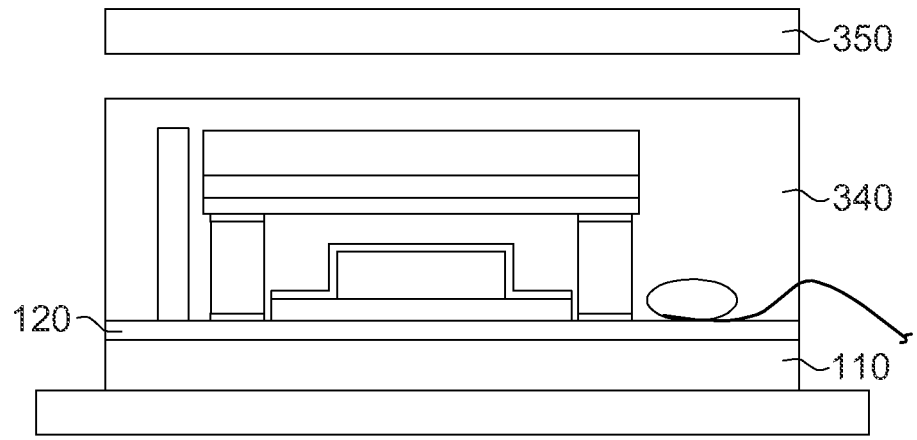

As shown in FIG. 4E, the encapsulating glue 340 may further be formed on the first flexible substrate 110. After the encapsulating glue 340 is coated on the first flexible substrate 110, the first functional film 350 may be further adhered to the encapsulating glue 340. The first functional film 350 is water-oxygen resistant, and the thickness of the first functional film 350 is about 200-300 μm; such thickness makes the first functional film 350 have a higher rigidity compared to the first flexible substrate 110 and the second flexible substrate 130, such that the first functional film 350 can provide a sufficient support for the device after the rigid carrier 410 is removed later, and the whole structure does not bend due to the lack of support, facilitating the proceedings of other subsequent processes (e.g. adhesion of the second functional film 360).

Figure 4F:
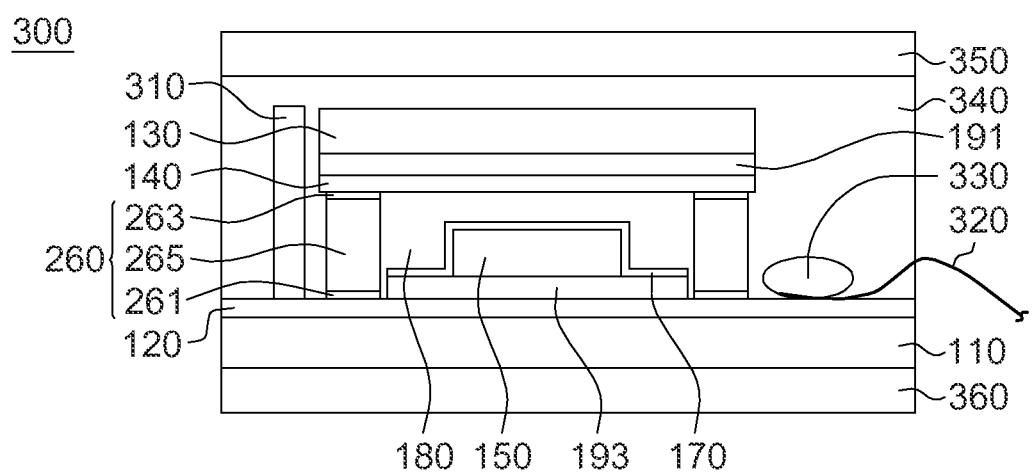

As shown in FIG. 4F, the rigid carrier 410 may be further removed.

Next, the second functional film 360 may be adhered below the second flexible substrate 130. As such, the organic light emitting diode display device 300 as shown in FIG. 4F (FIG. 3) is formed.

FIGS. 5A-5D illustrate a process for manufacturing an organic light emitting diode display device according to another embodiment of the present disclosure. Please refer to FIGS. 5A-5D and FIGS. 4D-4F.

Figure 5A:
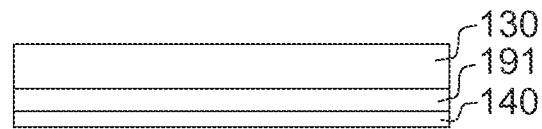
FIGS. 5A-5D illustrate a process for manufacturing an organic light emitting diode display device according to another embodiment of the present disclosure.
Figure 5A:
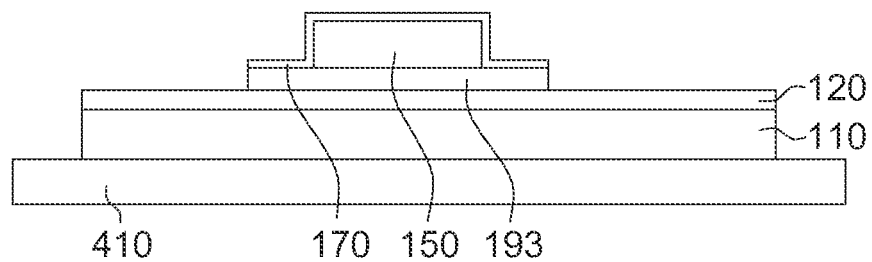

As shown in FIG. 5A, the rigid carrier 410 is provided, and the first flexible substrate 110 is formed on the rigid carrier 410. Next, the first barrier layer 120 and the second barrier layer 140 are formed on the first flexible substrate 110 and the second flexible substrate 130, respectively, and the organic light emitting diode element 150 is formed on the first flexible substrate 110. Next, the third barrier layer 170, the thin film transistor layer 193, and/or the color filter 191 may be further disposed.

Figure 5B:
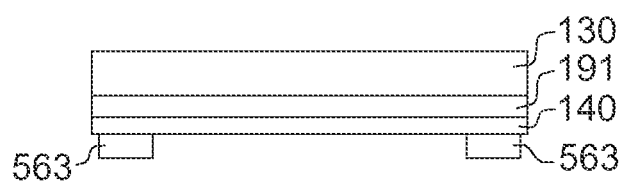
Figure 5B:
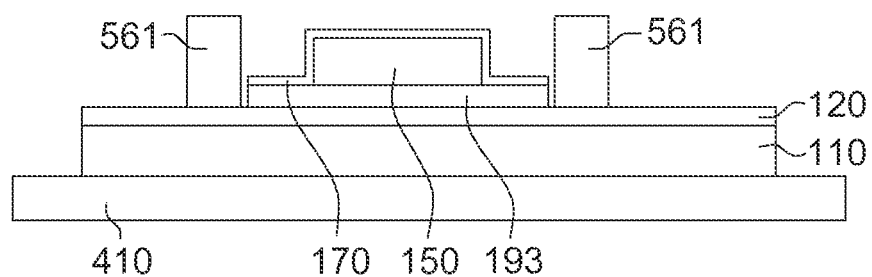

As shown in FIG. 5B, the first patterned metal layer 561 is formed on the first flexible substrate 110, and the second patterned metal layer 563 is formed on the second flexible substrate 130. The materials of the first patterned metal layer 561 and the second patterned metal layer 563 are the same. In the embodiment, prior to the formation of the first patterned metal layer 561 and the second patterned metal layer 563, microstructures may be formed on the surfaces where the metal layers 561 and 563 are predetermined to be formed on, such that the later-formed metal enclosing wall (lateral water-oxygen resistant structure) can be provided with superior water-oxygen resistant abilities.

In the embodiment, the first patterned metal layer 561 and the second patterned metal layer 563 are formed by such as opening a mask and performing a sputtering process. In the embodiment, the thickness of the first patterned metal layer 561 and the thickness of the second patterned metal layer 563 are about 4-5 μm.

Figure 5C:
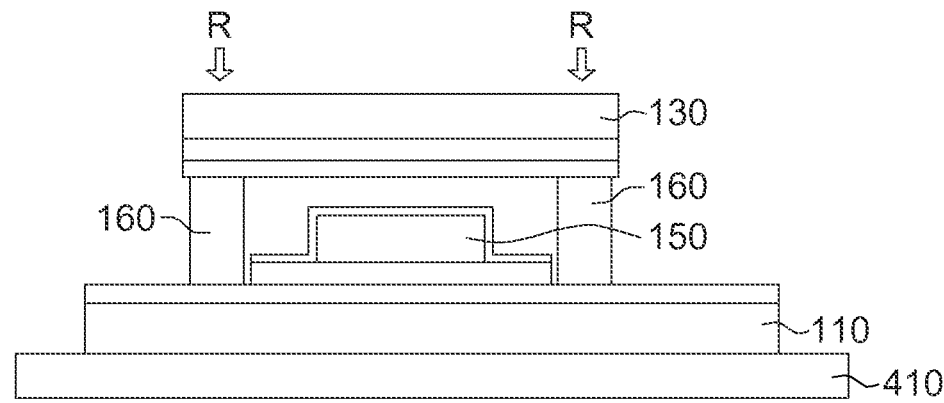

As shown in FIG. 5C, the first flexible substrate 110 is assembled to the second flexible substrate 130, and the first patterned metal layer 561 and the second patterned metal layer 563 are heated to form the metal enclosing wall 160. The metal enclosing wall 160 connects the first flexible substrate 110 to the second flexible substrate 130 and surrounds the organic light emitting diode element 150, such that the organic light emitting diode element 150 is nicely sealed between the first flexible substrate 110 and the second flexible substrate 130. In the embodiment, prior to assembling the substrates, the filler 180 is further provided to cover the organic light emitting diode element 150.

In the embodiment, the heating treatment is performed locally on the regions where the first patterned metal layer 561 and the second patterned metal layer 563 are located. While the regions are being heated, a pressure is applied to the same regions simultaneously as well; for example, as shown in FIG. 5C, the regions are heated and pressed along the direction indicated by the arrow R. In the embodiment, the materials of the first patterned metal layer 561 and the second patterned metal layer 563 are the same, such that the first patterned metal layer 561 and the second patterned metal layer 563 can form the metal enclosing wall 160 having a continuous wall structure after being heated and pressed, and hence a more compact structure is manufactured, providing a superior water-oxygen resistant effect. In the embodiment, the materials of the first patterned metal layer 561 and the second patterned metal layer 563 may include a metal with a low melting point or a solid solution metal. The metal with a low melting point is such as tin (Sn). The solid solution metal is such as tin-gold (SnAu) alloy, tin-nickel (SnNi) alloy, tin-antimony (SnSb) alloy, tin-lead (SnPb) alloy, tin-bismuth (SnBi) alloy, and/or tin-copper (SnCu) alloy. These alloys have alloy phases formed by dissolving solute atoms into lattices of metal solvents at set ratios of the solute atoms to the metal solvents. The elements from the solute and from the solvent are miscible in both liquid phase and solid phase, forming a uniform material. In one embodiment, the tin-lead (SnPb) alloy includes such as 63% atomic ratio of tin and 37% atomic ratio of lead, and the melting point of the alloy is 183°

C. In the embodiment, the first patterned metal layer 561 and the second patterned metal layer 563 are heated at a temperature of lower than 230° C. and pressed at a pressure of lower than 2 MPa. However, the conditions of the heating treatment and the pressing treatments performed to the patterned metal layers 561 and 563 may vary depending the actual applications and are not limited thereto, as long as the properties of the already-formed elements are not influenced (e.g. when the temperature is too high, the elements or the flexible substrates may be damaged, or the layers may peel) and the metal layers 561 and 563 can melt and form the metal enclosing wall 160 having a continuous wall structure.

Figure 5D:
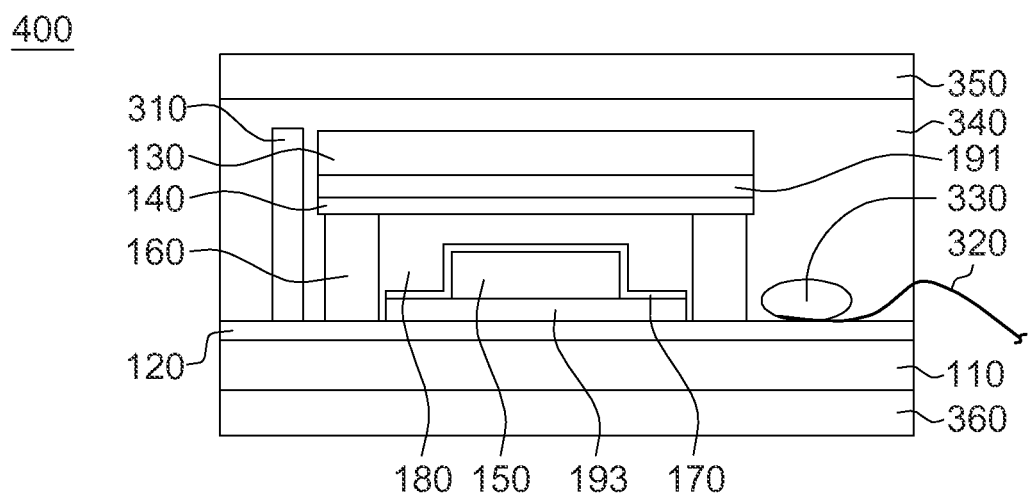

Next as described in the previous embodiments as shown in FIGS. 4D-4F, the IC component 310, the flexible cable 320, and the solder pad 330 are disposed, the encapsulating glue 340 is formed, the first functional film 350 is adhered, the rigid carrier 410 is removed, and the second functional film 360 is adhered. As such, the organic light emitting diode display device 400 as shown in FIG. 5D is formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An organic light emitting diode (OLED) display device, comprising:
    a first flexible substrate;
    a first barrier layer disposed on the first flexible substrate;
    a second flexible substrate;
    a second barrier layer disposed on the second flexible substrate;
    an organic light emitting diode element disposed between the first barrier layer and the second barrier layer;
    a metal enclosing wall connecting the first flexible substrate to the second flexible substrate and surrounding the organic light emitting diode element; and
    an encapsulating glue covering the first flexible substrate, the second flexible substrate, and the metal enclosing wall.

2. The organic light emitting diode display device according to claim 1, wherein the material of the metal enclosing wall comprises tin (Sn) or a solid solution metal, wherein the solid solution metal is tin-gold (SnAu) alloy, tin-nickel (SnNi) alloy, tin-antimony (SnSb) alloy, tin-lead (SnPb) alloy, tin-bismuth (SnBi) alloy, tin-copper (SnCu) alloy, or combinations thereof.

3. The organic light emitting diode display device according to claim 1, wherein the metal enclosing wall further comprises:
    a first metal layer connected to the first flexible substrate;
    a second metal layer connected to the second flexible substrate; and
    a third metal layer formed between the first metal layer and the second metal layer, wherein the material of the third metal layer is different from the materials of the first metal layer and the second metal layer.

4. The organic light emitting diode display device according to claim 3, wherein each of the interfaces between the first metal layer and the third metal layer and between the second metal layer and the third metal layer has a microstructure formed thereon, respectively.

5. The organic light emitting diode display device according to claim 3, wherein the thickness of the first metal layer and the thickness of the second metal layer are 300-1000 nm.

6. The organic light emitting diode display device according to claim 3, wherein the material of the first metal layer and the material of the second metal layer comprise aluminum (Al), molybdenum (Mo), aluminum-niobium (AlNb) alloy, tin, or a solid solution metal, wherein the solid solution metal is tin-gold (SnAu) alloy, tin-nickel (SnNi) alloy, tin-antimony (SnSb) alloy, tin-lead (SnPb) alloy, tin-bismuth (SnBi) alloy, tin-copper (SnCu) alloy, or combinations thereof.

7. The organic light emitting diode display device according to claim 3, wherein the material of the third metal layer comprises an organic-inorganic mixture material, the organic-inorganic mixture material comprising an organic material portion and an inorganic material portion, the organic material portion comprises a water resistant colloid, the inorganic material portion comprises tin or a solid solution metal, and the solid solution metal is tin-gold (SnAu) alloy, tin-nickel (SnNi) alloy, tin-antimony (SnSb) alloy, tin-lead (SnPb) alloy, tin-bismuth (SnBi) alloy, tin-copper (SnCu) alloy, or combinations thereof.

8. The organic light emitting diode display device according to claim 1, further comprising a third barrier layer covering the organic light emitting diode element.

9. The organic light emitting diode display device according to claim 1, further comprising a filler filled inside the metal enclosing wall and covering the organic light emitting diode element.

10. The organic light emitting diode display device according to claim 1, further comprising an IC component, a flexible cable, or the combination of both bonded to the first flexible substrate.

11. The organic light emitting diode display device according to claim 10, further comprising a first functional film adhered onto the encapsulating glue, wherein the thickness of the first functional film is about 200-300 μm.

12. The organic light emitting diode display device according to claim 1, further comprising a color filter disposed between the second flexible substrate and the organic light emitting diode element.

13. The organic light emitting diode display device according to claim 1, further comprising a thin film transistor layer disposed between the first flexible substrate and the organic light emitting diode element.

* * * * *